US012603210B2

(12) United States Patent
Gan et al.

(10) Patent No.: US 12,603,210 B2
(45) Date of Patent: Apr. 14, 2026

(54) POWER MODULES WITH ELEVATED INDUCTORS AND CAPACITORS ARRANGED UNDER THE INDUCTORS

(71) Applicant: Google LLC, Mountain View, CA (US)

(72) Inventors: Houle Gan, Santa Clara, CA (US);
Shuai Jiang, San Jose, CA (US);
Gregory Sizikov, Sunnyvale, CA (US);
Xin Li, San Jose, CA (US); Chee Yee Chung, Milpitas, CA (US)

(73) Assignee: Google LLC, Mountain View, CA (US)

( * ) Notice: Subject to any disclaimer, the term of this patent is extended or adjusted under 35 U.S.C. 154(b) by 155 days.

(21) Appl. No.: 18/590,577

(22) Filed: Feb. 28, 2024

(65) Prior Publication Data

US 2024/0203630 A1 Jun. 20, 2024

Related U.S. Application Data

(62) Division of application No. 16/800,776, filed on Feb. 25, 2020, now Pat. No. 11,948,716.

(51) Int. Cl.
*H01F 17/00* (2006.01)
*H05K 5/00* (2006.01)

(52) U.S. Cl.
CPC ....... *H01F 17/0006* (2013.01); *H05K 5/0069* (2013.01)

(58) Field of Classification Search
CPC .......................... H01F 17/0006; H05K 5/0069
USPC ........................................................ 361/748
See application file for complete search history.

(56) References Cited

U.S. PATENT DOCUMENTS

| | | | |
|---|---|---|---|
| 2,451,596 | A | 10/1948 | Wheeler |
| 6,232,847 | B1 | 5/2001 | Marcy et al. |
| 6,922,127 | B2 | 7/2005 | Zou et al. |
| 8,276,002 | B2 | 9/2012 | Dennard et al. |

(Continued)

FOREIGN PATENT DOCUMENTS

| | | |
|---|---|---|
| EP | 2656385 | 12/2017 |
| JP | 2004-152947 | 5/2004 |
| JP | 2005-051357 | 2/2005 |

OTHER PUBLICATIONS

Coilcraft.com [online], "XAR7030 Series Raised Power Inductors," Nov. 2018, retrieved on Feb. 24, 2020, retrieved from: URL <https://www.coilcraft.com/xar7030.cfm>, 2 pages.

(Continued)

*Primary Examiner* — Andargie M Aychillhum
(74) *Attorney, Agent, or Firm* — Fish & Richardson P.C.

(57) ABSTRACT

The disclosure relates to power modules that include elevated inductors with capacitors disposed under the inductors. In one aspect, a power module includes a first circuit board having a first surface and a second surface opposite the first surface. One or more inductors are mounted on the first surface. Each of the one or more inductors includes a top surface and a bottom surface opposite the top surface and that faces the first surface of the first circuit board. Each inductor is elevated above the first surface of the first circuit board such that at least a portion of the bottom surface of the inductor does not contact the first surface of the first circuit board. The first circuit board includes capacitors arranged in an area below the portion of the bottom surface of the inductor that does not contact the first surface of the first circuit board.

19 Claims, 5 Drawing Sheets

(56)                 References Cited

U.S. PATENT DOCUMENTS

| 2009/0108821 | A1 | | 4/2009 | Standing | |
|---|---|---|---|---|---|
| 2009/0160595 | A1 | | 6/2009 | Feng et al. | |
| 2012/0051016 | A1 | * | 3/2012 | Rathburn | H01R 12/57 |
| | | | | | 174/262 |
| 2013/0135834 | A1 | * | 5/2013 | Horikawa | H01R 43/00 |
| | | | | | 29/874 |

OTHER PUBLICATIONS

Kisacoresearch.com [online], "The Need for New A1 Processor Power Delivery," 2019, retrieved on Feb. 24, 2020, retrieved from: URL <https://www.kisacoresearch.com/sites/default/files/presentations/12.05 _-_ vicor _-robert gendron.pdf>, 19 pages.
Tdcommons.org [online], "Massive On-Die Capacitor for Integrated Circuits," 2018, retrieved on Feb. 24, 2020, retrieved from: URL <https://www.tdcommons.org/dpubs_series/1157/>, 1 page.
Vicorpower.com [online], "The Future of Power Integrity," 2019,retrieved on Feb. 24, 2020, retrieved from: URL <http://www.vicorpower.com/documents/press_releases/3-pages-Vicor-Vertical-Power-Delivery-DesignCon19.pdf>, 3 pages.

* cited by examiner

POWER MODULES WITH ELEVATED INDUCTORS AND CAPACITORS ARRANGED UNDER THE INDUCTORS

CROSS REFERENCE TO RELATED APPLICATION

This application is a divisional of U.S. application Ser. No. 16/800,776 filed Feb. 25, 2020. The disclosure of the prior application is considered part of and is incorporated by reference in the disclosure of this application.

BACKGROUND

Vertical power delivery has been developed to supply high current (e.g., 1,000+ amps) at low voltage (e.g., 0.8 volts) for high performance computing application-specific integrated circuits (ASICs), graphics processing units (GPUs), central processing units (CPUs), and field-programmable gate arrays (FPGAs). Vertical power delivery involves placing high-density power modules underneath the chip shadow on the bottom side of the printed circuit board (PCB) opposite the chip side to place them closer to the chip and minimize parasitics along the power delivery path, including resistance and inductance associated with lateral metal planes in other power delivery designs.

SUMMARY

This specification describes power modules that include elevated inductors with capacitors disposed under the inductors. The area under an ASIC or other IC for implementing a high-density power module is typically very limited based on the chip size of the IC and its pinout. By placing such modules on the bottom side of the PCB, a significant number (e.g., in the hundreds or greater) of on-board decoupling capacitors are included on the power module itself rather than on the same side of the PCB as the IC. Otherwise, the transient performance of the power rail between the power module and the IC will suffer from reduced amount of capacitance, rendering the vertical power to an inferior solution from a power integrity standpoint.

The power modules described in this document include one or more elevated inductors that are raised above a surface of the power module. By elevating the inductors above the surface, the decoupling capacitors can be arranged under the inductor, allowing for the power module to include more capacitors and/or a smaller surface area.

In general, one innovative aspect of the subject matter described in this specification can be embodied in power modules that include a first circuit board comprising a first surface and a second surface opposite the first surface and one or more inductors mounted on the first surface of the first circuit board. Each of the one or more inductors includes a top surface and a bottom surface opposite the top surface and that faces the first surface of the first circuit board. Each of the one or more inductors is elevated above the first surface of the first circuit board such that at least a portion of the bottom surface of the inductor does not contact the first surface of the first circuit board. For each of the one or more inductors, the first circuit board includes multiple capacitors arranged in an area below the portion of the bottom surface of the inductor that does not contact the first surface of the first circuit board.

These and other implementations can each optionally include one or more of the following features. In some aspects, each of the one or more inductors are mounted on one or more posts that extend from the inductor to the first surface of the first circuit board. The capacitors for each inductor can include decoupling capacitors that are electrically connected to the inductor using conductors of the first circuit board. In some aspects, at least one of the one or more inductors includes a dual-fed bridge coupled inductor that includes multiple inductor core posts that electrically connect the inductor to conductors of the first circuit board and support the inductor on the first surface of the first circuit board.

Some aspects include multiple power stage components mounted on the first surface of the first circuit board. Each of the one or more inductors can include a coupled inductor electrically connected to at least one of the power stage components. The power stage components, one or more inductors, and the capacitors for each inductor form one or more switching power supplies configured to provide power to an integrated circuit of a printed circuit board to which the power module is connected.

Some aspects include one or more cavities in the second surface of the first circuit board. Each cavity is configured to receive a capacitor mounted on a surface of a printed circuit board when the power module is installed on the surface of the printed circuit board.

In some aspects, the first circuit board includes connectors configured to match a pinout of an integrated circuit of a printed circuit board to which the power module is to be connected. The one or more inductors and at least a portion of the capacitors are part of a power circuit configured to provide power to the integrated circuit. The connectors can include at least one of land grid array pads or ball grid array balls. The connectors are configured to match the pinout of the integrated circuit such that one or more conductors that connect a component of the first circuit board to respective one or more pins of the integrated circuit extend in a substantially straight line from the component to the respective one or more pins.

In general, another innovative aspect of the subject matter described in this specification can be embodied in apparatus that include a printed circuit board (PCB) having a first PCB surface and a second PCB surface opposite the first PCB surface, one or more integrated circuits (ICs) attached to the first PCB surface, and one or more power modules attached to the second PCB surface. Each power module can include an interposer board (IB) having a first IB surface and a second IB surface opposite the first surface and one or more inductors mounted on the first IB surface. Each of the one or more inductors includes a top surface and a bottom surface opposite the top surface and that faces the first IB surface. Each of the one or more inductors is elevated above the first IB surface such that at least a portion of the bottom surface of the inductor does not contact the first IB surface. For each of the one or more inductors, the interposer board includes capacitors arranged in an area below the portion of the bottom surface of the inductor that does not contact the first IB surface.

These and other implementations can each optionally include one or more of the following features. In some aspects, each IC consumes a respective first area of the first PCB surface and the one or more power modules include a respective power module for each IC. The respective power module for each IC is installed in a respective second area of the second PCB surface directly opposite the respective first area for the IC.

In some aspects, the second PCB surface includes capacitors that each include a portion that extends from the second PCB surface. The second IB surface includes, for each of the capacitors, a cavity configured to receive the portion that extends from the second PCB surface.

Some aspects include a heat sink attached to the second PCB surface. The heat sink is configured to fit around the one or more inductors and each other component attached to the first IB surface. The heat sink provides a bolster plate that prevents the PCB from warping. The first IB surface includes one or more power stage components. The heatsink contacts each of the one or more power stage components. In some aspects, each of the one or more inductors are mounted on one or more posts that extend from the inductor to the first surface of the interposer board.

In some aspects, the IB includes, for each of the one or more ICs, a connectors configured to match a pinout of the IC. The one or more inductors and at least a portion of the capacitors of each power module are part of a power circuit configured to provide power to the IC. The connectors include at least one of land grid array pads or ball grid array balls. The connectors are configured to match the pinout of the IC such that one or more conductors that connect a component of the IB to respective one or more pins of the IC extend in a substantially straight line from the component to the respective one or more pins.

In some aspects, at least one of the one or more inductors includes a dual-fed bridge coupled inductor comprising inductor core posts that electrically connect the inductor to conductors of the IB and support the inductor on the first IB surface.

The subject matter described in this specification can be implemented in particular embodiments so as to realize one or more of the following advantages. By elevating inductors above a surface of a power module, e.g., the surface of an interposer board (or other circuit board) of the power module, the power module includes more area along the surface for capacitors, e.g., decoupling and/or output capacitors. This enables power modules to include more capacitors than the modules could have without elevated inductors and/or enables smaller module sizes. By including more capacitors, the power modules can support higher current and, therefore, higher power, than without the additional capacitors. The additional capacitors can also provide a better transient response. By arranging the capacitors under the inductors, the interposer boards include more peripheral space outside of the inductors for other components, e.g., power stage components and/or additional capacitors.

By reducing the size of the power modules, the power modules can be used to provide vertical power delivery for ICs that normally could not use vertical power delivery due to the limited space under the ICs and the required size of the power modules. The interposer board can also include cavities on the surface facing the PCB, enabling additional capacitors to be installed on the surface of the PCB facing the interposer board as the capacitors can extend from the surface of the PCB into the cavities when the interposer board is installed on the PCB.

The power modules having elevated inductors and capacitors under the inductors can reduce the IR loss of the power modules, e.g., by about 60-70% in some cases, relative to conventional lateral solutions in which the decoupling capacitors are installed on the same side of the PCB as the IC. These power modules can also result in a significant reduction in PCB IR drop, e.g., by about 75% in some cases. These reductions in IR loss result in more efficient power modules and the reductions can be achieved while maintaining the transient performance due to the added capacitors under the inductors.

Various features and advantages of the foregoing subject matter are described below with respect to the figures. Additional features and advantages are apparent from the subject matter described herein and the claims.

BRIEF DESCRIPTION OF THE DRAWINGS

Like reference numbers and designations in the various drawings indicate like elements.

DETAILED DESCRIPTION

In general, this document describes power modules for vertical power delivery to loads, such as ASICs, GPUs, CPUs, FPGAs, and other ICs. As the area under ICs for arranging power modules for vertical power delivery is limited, typically by the size of the IC and its pinout, the area on the surface of the power modules for mounting components is also limited. To fit the many, e.g., hundreds of, capacitors typically required in such vertical power delivery applications, the inductors of the power modules can be elevated above the surface of the power modules such that at least some of the capacitors are arranged below the inductors.

Terms such as "first," "second," "top," "bottom," "front," "back," "above," and "below" are used to distinguish one component from another and/or their relative positions. Such terms are not meant to denote a preference or a particular orientation and are not meant to denote absolute positions. Thus, if a component is referred to as being above another component, the component can also be below or to the side of the component, e.g., if an apparatus that includes the components is rotated or otherwise adjusted.

Figure 1:
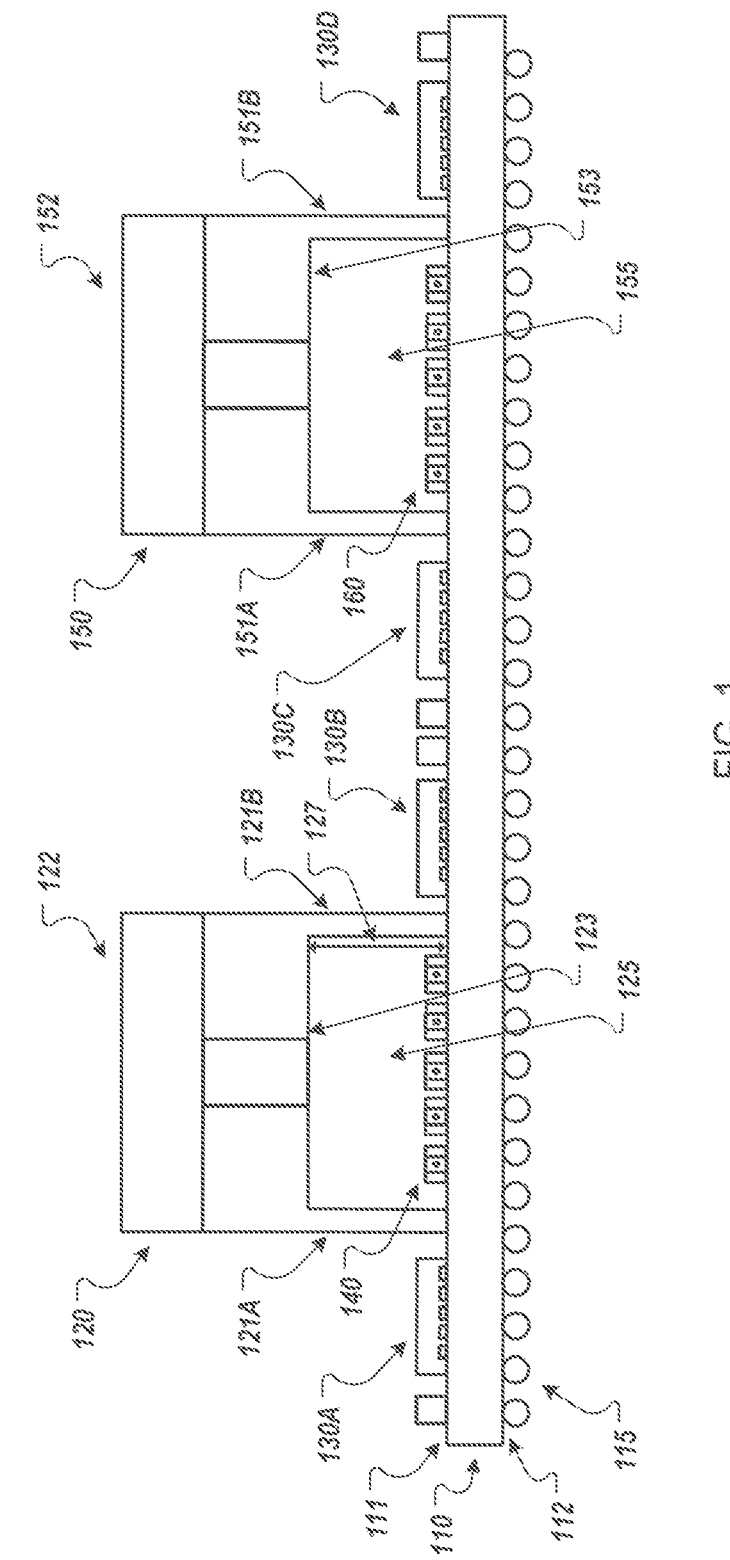
FIG. 1 is a side view of an example power module.

FIG. 1 is a side view of an example power module 100. The power module 100 includes an interposer board 110 that has a first surface 111 and a second surface 112 opposite the first surface 111. Although an interposer board 110 is used in this example, other circuit boards can be used in place of the interposer board 110 in the power module 100 of FIG. 1 and the other power modules described in this document.

The interposer board 110 can be a substrate, e.g., a silicon substrate, on which electrical components are supported, e.g., mounted, attached, or embedded. The interposer board 110 includes connectors 115 for electrically connecting the electrical components to a PCB, as described in more detail below. The connectors 115 can be in the form of land grid array (LGA) pads, ball grid array (BGA) balls, or another appropriate type of connector.

The power module 100 can be configured for vertical power delivery applications in which the power module 100 is arranged under a load, e.g., under ASICs, GPUs, CPUs, FPGAs, and other ICs. For example, as described below, the load can be supported by (e.g., attached to or mounted on) one side of a PCB and the connectors 115 can be used to connect the power module 110 to the other side of the PCB, e.g., under (or above) the load. In vertical power delivery, the power source for the load is typically arranged within the footprint of the load, within the pinout of the load, or within a perimeter that does not extend more than a threshold distance from the footprint of the load or its pinout. The power module 100 can be arranged on the other side of the PCB within this defined area.

The power module 100 can include electrical components for providing power to the load. In this example, the power module 100 includes inductors 120 and 150, capacitors 140 and 160, and power stage components 130A-130D. The power module 100 can include various quantities of inductors, capacitors, and power stage components.

Each power stage 130A-130D can include power circuitry for providing power to the load. In some implementations, each power stage 130A-130D includes voltage regulator components, such as one or more Metal Oxide Semiconductor Field Effect Transistors (MOSFETs). As each power stage 130A-130D can be capable of outputting up to a maximum amount of current, the number of power stages 130A-130D can be selected based on the current requirements of the load.

The power stages 130A-130D can be part of switching converter circuits, e.g., part of Buck converter circuits. Such switching converter circuits include inductors, e.g., the inductors 120 and 150, and capacitors, e.g., at least some of the capacitors 140 and 150. As such, the power modules having elevated inductors described in this document are particularly beneficial for switching converter-based vertical power delivery. However, the power modules can be applied in other applications that include inductors.

The inductors 120 and 150 can be in the form of various types of inductors, such as coupled inductors, e.g., dual-fed bridge (DFB) inductors, multi-fed polygon inductors, or another appropriate type of inductor. A coupled inductor includes two or more windings on a common core and are often used as DC-DC converters in power applications.

A DFB inductor can interface with power stages on each side of the inductor, resulting in high utilization of magnetic core flux density, reduced physical dimensions, and flexible layout possibilities. A DFB inductor can include multiple phases and, for each phase, a post that electrically connects the DFB inductor to a conductor of the interposer board 110. Each post serves as an inductor core and has a pulse-width modulated (PWM) waveform applied to the post. The posts generate magnetizing flux for open-loop self-inductance for each of the phases. A DFB inductor can also include another post, e.g., that is larger than the other posts, that provides a common mode leakage flux path that generates the common mode output inductance. This post can also be electrically connected to a conductor of the interposer board 110. In addition to their roles in the inductor, the posts can support the inductor on the interposer board.

The capacitors 140 and 160 can include capacitors for switching power converters and decoupling capacitors that decouple the components of the power module 100 from the load when the power module 100 is connected to a PCB that has the load. The capacitors 140 and 160 can be ceramic capacitors, e.g., multilayer ceramic capacitors (MLCCs), or another appropriate type of capacitor.

The inductor 120 includes a first surface, also referred to as a top surface 122 for ease of description, and a second surface, also referred to as a bottom surface 123. Similarly, the inductor 150 includes a first surface (top surface 152) and a second surface (bottom surface 153). Although each of the surfaces 122, 123, 152, and 153 are shown as being flat, the surfaces can have other shapes, e.g., round, stepped, non-uniform, etc. The inductors 120 and 150 are elevated above the surface 111 of the interposer board 110 such that the second surfaces 123 and 153 are both spaced apart from the surface 111 of the interposer board 110. That is, the bottom surfaces 123 and 153 do not contact the surface 111 of the interposer board 110. In other implementations, a portion of the bottom surfaces 123 and 153 may contact the surface 111, but at least a portion of the bottom surfaces 123 and 153 do not make contact with the surface 111. For example, the bottom surfaces 123 and 153 can be slanted at an angle with respect to the surface or may form a dome over a portion of the surface 111.

Each inductor 120 and 150 can be elevated using one or more posts that extend from the inductor 120 and 150 to the surface 111 of the interposer board 110. The posts can attach the inductors 120 and 150 to the interposer board 110. The posts can be made of a conductor or include a conductor, e.g., within an insulator, to electrically connect the inductor to conductors, e.g., traces, of the interposer board. For example, as described above, each post can serve as an inductor core of a DFB inductor.

By elevating the inductors 120 and 150 and separating the bottom surfaces 123 and 153 from the surface 111 of the interposer board 110, spaces are created under the inductors 120 and 150 for other components. That is, other components can be attached to or mounted on the surface 111 of the interposer board 110 in an area 125 under the inductor 120, e.g., between the second surface 123 and the surface 111. Similarly, other components can be attached to or mounted on the surface 111 of the interposer board 110 in an area 155 under the inductor 150, e.g., between the bottom surface 123 of the inductor 120 and the surface 111 of the interposer board 110. Such components can also be partially embedded in the interposer board 110 in those areas, e.g., with a portion of the components extending above the surface 111 into the area 125 or 155.

In this example, the area 125 includes the capacitors 140 and the area 155 includes the capacitors 160. By elevating the inductors 120 and 150 in this way, the power module 110 can include many more capacitors than if the inductors 120 and 150 were mounted directly onto the surface 111 of the interposer board 110. This allows for higher current, and thus higher power, power modules 100 to fit within the limited area under loads. This also results in reduced IR losses for the power module 100 and a PCB to which the power module 100 is attached. This also allows for more space on the surface 111 of the interposer board 110 for other components, e.g., more power stage components, more inductors and associated capacitors, etc. Although the capacitors 140 and 160 are shown as being under the inductors 120 and 150, respectively, capacitors can be arranged in other areas of the surface 111 of the interposer board 110 outside of these areas.

The distance 127 at which the inductors 120 and 150 are elevated above the surface 111 of the interposer board 110 can vary depending on the implementation and/or the size of the components being arranged under the inductors 120 and 150. For example, the inductor 120 can be elevated such that the second surface 123 is 1-5 millimeters (mm) above the surface 111 of the interposer board 110 to allow for the capacitors 140 to fit under the inductor 120 without contacting the inductor 120.

Figure 2:
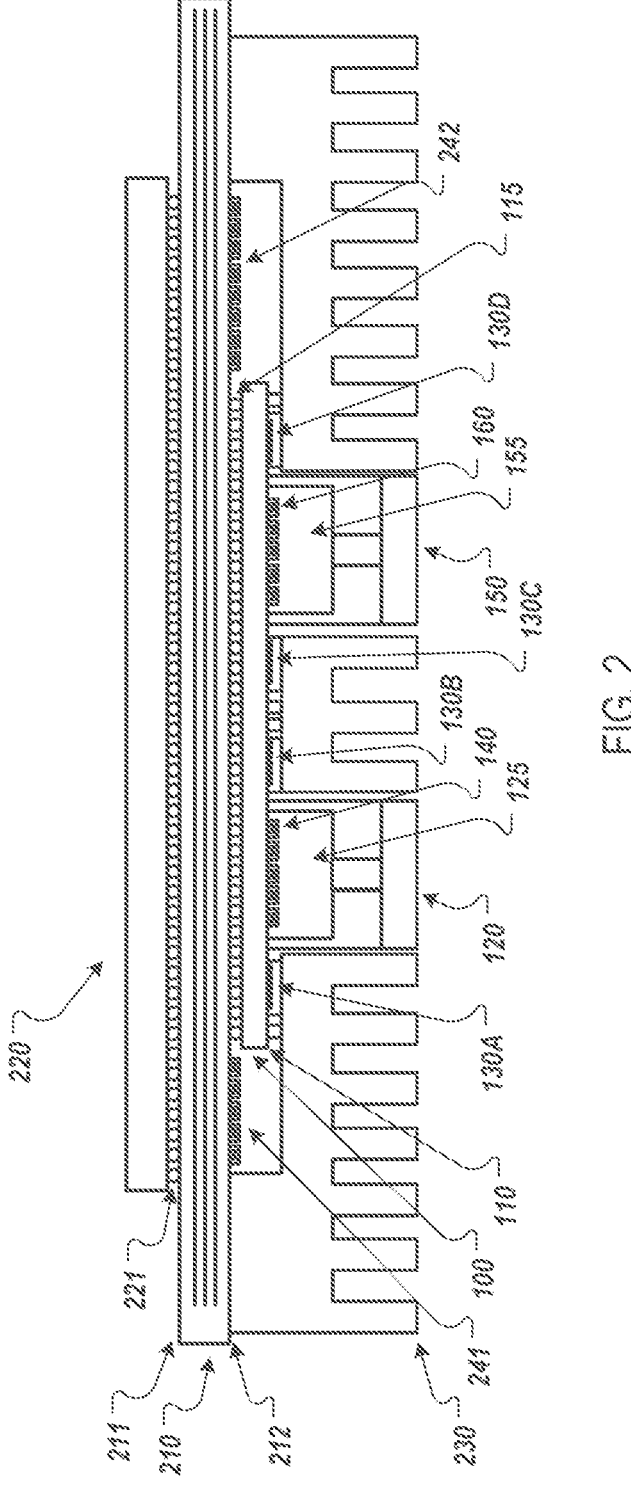
FIG. 2 is a side view of an example apparatus that includes a PCB with a power module.

FIG. 2 is a side view of an apparatus 200 that includes a PCB 210 with the example power module 100 attached thereto. The PCB 210 includes a first surface 211 and a second surface 212 opposite the first surface 211. The apparatus 200 also includes a load 220 supported, e.g., attached to or mounted on, the first surface 211 of the PCB 210. The load 220 can be an ASIC, GPU, CPU, FPGA, other IC, or other type of electrically load. The load 220 can be mounted on the first surface 221 using connectors, e.g., BGA balls as shown or LGA pads.

The power module 100 is mounted on the second surface 212 of the PCB 200 using the connectors 115. The power module 100 is arranged under (or above if rotated 90 degrees) the load 220. In this example, power module 100 is arranged on the second surface 212 such that the perimeter of the power module 100 is within an area defined by the perimeter of the load 220. In other words, the power module 100 is within the footprint or shadow of the load 220.

Although the apparatus 200 includes a single load 220 and a single power module 100, the apparatus 200 can include multiple loads and one or more power modules for each load, arranged in the same or a similar manner. For example, if a load has multiple power modules, each power module can be arranged within the area defined by the perimeter of the load, or extending up to a threshold distance out of the area.

The apparatus 200 also includes a heatsink 230. The heatsink 230 transfers heat from the components of the power module 100. Advantageously, the heatsink 230 is adapted to the shape of the power module 100. That is, the heatsink 230 is shaped such that the heatsink 230 contacts, or is within a threshold distance of the power stage components 130A-130D, while providing space for the inductors 120 and 150.

The heatsink 230 can also serve as a bolster plate for the power module 100 and the PCB 210. This can help hold the power module 100 to the PCB 210 and prevent the PCB from warping. This also precludes the need for a separate bolster plate on the other side of the PCB 210 with the load 220, resulting in a smaller, e.g., in height, apparatus 200.

Figure 3:
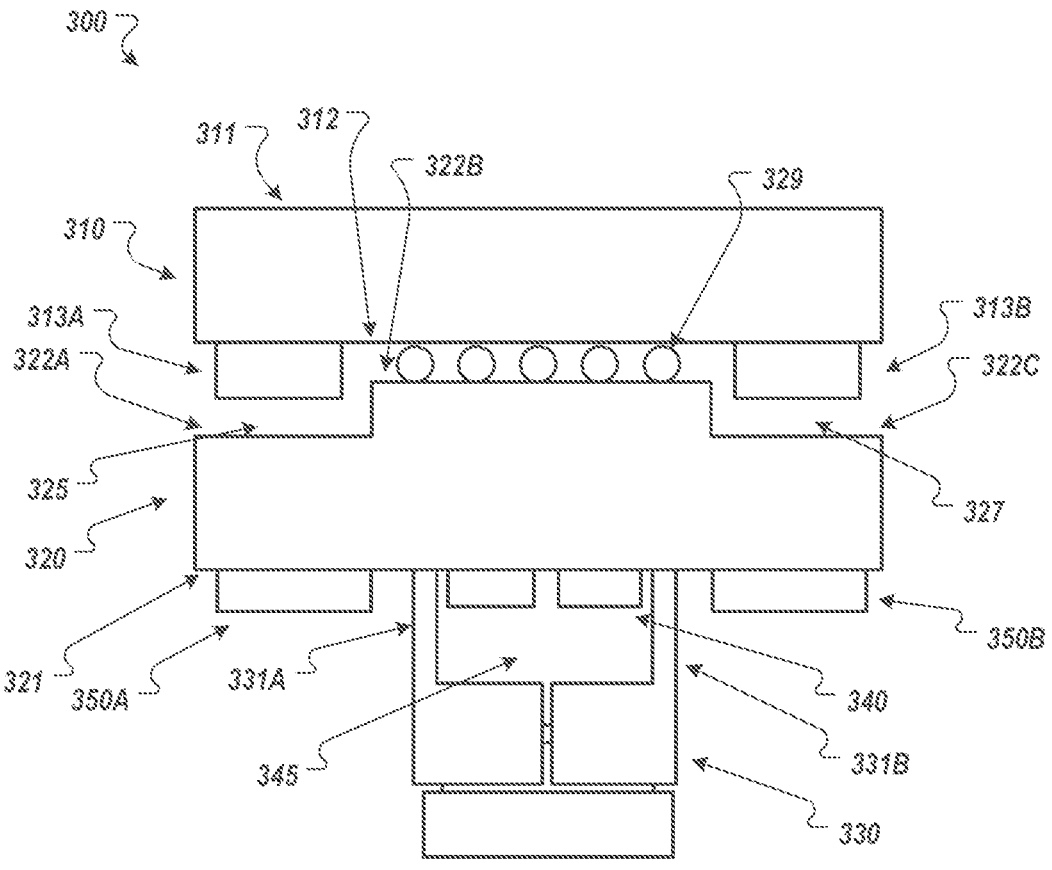
FIG. 3 is a diagram illustrating example cavities in an interposer board.

The second surface 212 of the PCB 210 also includes optional capacitors 241 and 242 supported, e.g., mounted, thereon. This allows for additional decoupling capacitors to improve the transient response of the power module 100. In this example, the capacitors 241 and 242 are mounted outside of the area of the second surface 212 in which the power module 100 is mounted. As shown in FIG. 3 and described below, capacitors can be mounted inside this area using cavities in the interposer board 110 and by not including connectors 115 in the areas where the capacitors are mounted.

The components and the connectors 115 of the power module 100 can be arranged based on the pinout of the load 220 and the connectors 221. For example, the connectors 115 for the components of the power module 100 can be arranged to match the pins (and connectors 221) of the load 220 to which the components will be electrically connected. In a particular example, an inductor and is connectors can be arranged on the surface 111 of the power module 100 such that, when the power module 100 is mounted on the PCB 210, the connectors for the inductor are directly below the connectors for the pins of the load 220 to which the inductor is to be electrically connected. In this way, the conductors, e.g., vias in the PCB 220, can be ran in a straight or substantially straight line, between the connectors 115 and the connectors 221, thereby reducing the length of the conductors, the resistance corresponding to the length, and the IR losses caused by this resistance. This also results in a less complex PCB design as the number of horizontal traces within the PCB 200 is reduced.

FIG. 3 is a diagram 300 illustrating example cavities 325 and 327 in an interposer board 320. This diagram 300 is a partial view of a power module that includes the interposer board 320 that is mounted on a PCB 310 using connectors

329. The interposer board 320 includes a first surface 321 and a second surface 322 that includes surfaces 322A-322C.

The power module includes an inductor 330 mounted on the first surface 321 of the interposer board 320, power stage components 350A and 350B, and capacitors 340 arranged in an area 345 under the inductor 330. The inductor 330 includes posts 331A and 331B that connect the inductor to the interposer board 320.

The PCB 310 includes a first surface 311 and a second surface 312. Although not shown, a load can be mounted on the first surface, as described above. The PCB 310 also includes capacitors 313A and 313B mounted on the second surface 312 of the PCB 310. To allow for the interposer board 320 to be mounted on the second surface 312 with the capacitors 313A and 313B, the interposer board 320 includes the cavities 325 and 327.

The cavities 325 and 327 are configured to receive the capacitors 313A and 313B when the interposer board 320 is mounted on the second surface 312 of the PCB 310. In particular, each cavity 325 and 327 provides an area into which one or more capacitors can extend. The size, e.g., depth, of the cavities 325 and 327 can be configured based on the height of the capacitors 313A and 313B, e.g., based on the distance to which the capacitors 313A and 313B extend from the second surface 312 of the PCB 310. Each cavity 325 and 327 also does not have any connectors 329. Instead, the connectors 329 can be arranged in other areas of the second surface 322 of the interposer board 320.

Figure 4A:
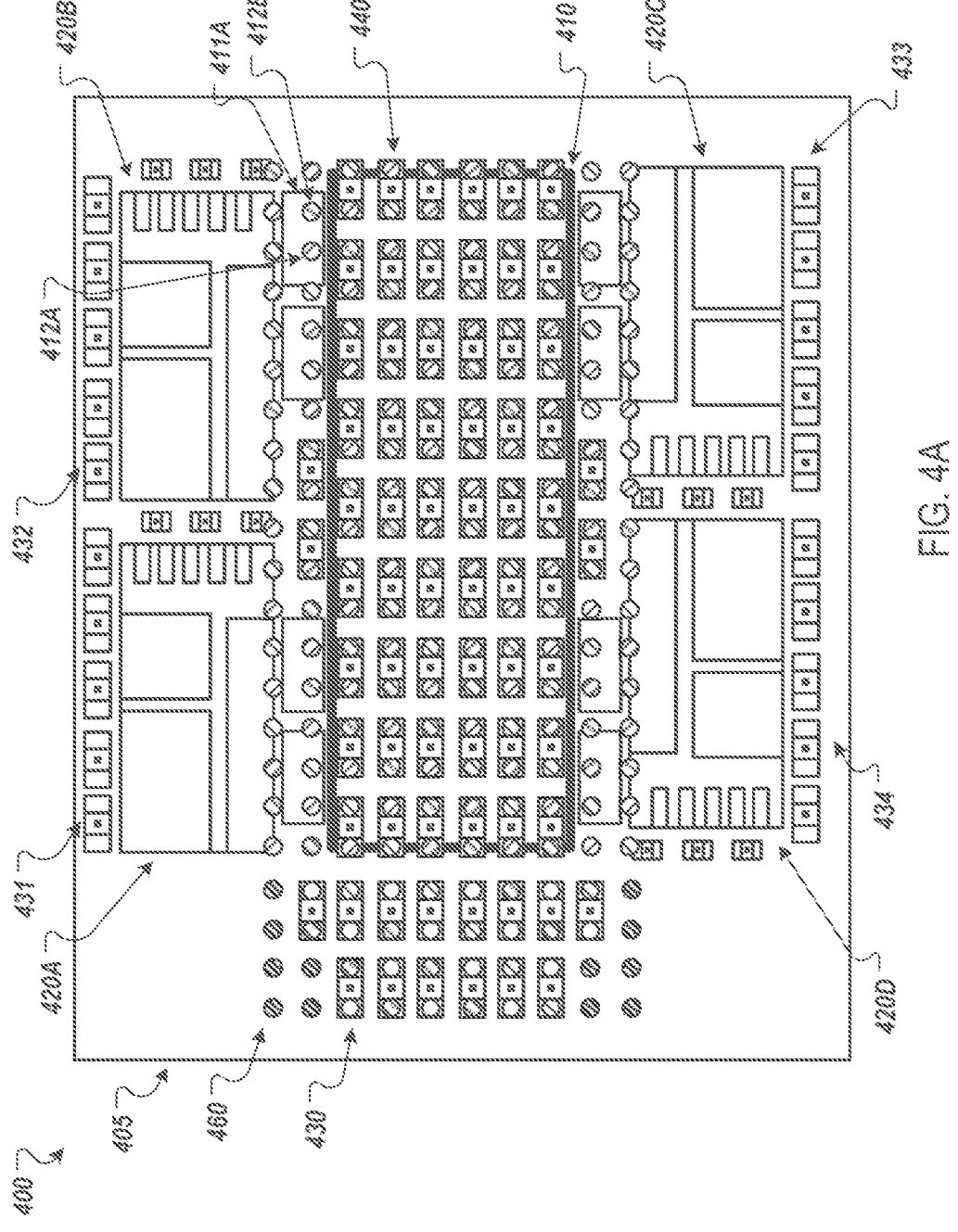
FIG. 4A is bottom view of an example interposer board of an example power module.
Figure 4B:
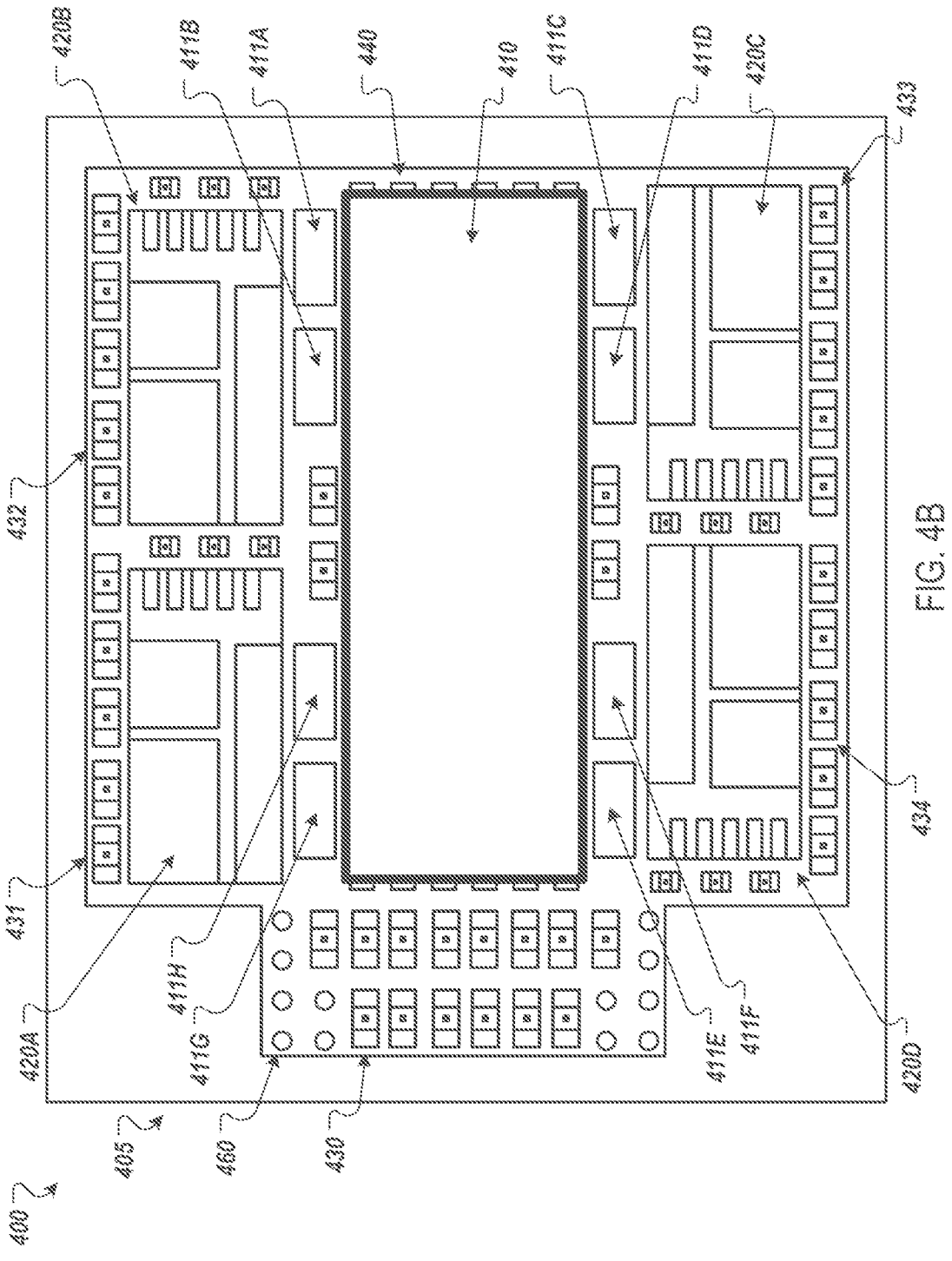
FIG. 4B is top view of the example interposer board of FIG. 4A.

FIG. 4A is block diagram of a bottom view of an example interposer board 405 of an example power module 400. This view shows the second surface of the interposer board 405 that is connected to a PCB. FIG. 4B is a block diagram of a top view of the interposer board 405. This view shows the first surface of the interposer board 405 on which the components of the power module 400 are mounted. The power module 400 can be similar to the power module 100 of FIGS. 1 and 2. For example, the power module 400 can include one or more elevated inductors and, for each inductor, capacitors arranged under the inductor.

The perimeter of an inductor is represented by the block 410, which is also referred to as the inductor 410 for ease of description. As best seen in FIG. 4B, the inductor 410 includes eight posts 411A-411G that connect the inductor 410 to the interposer board 405.

The interposer board 405 also includes capacitors 440 arranged under the inductor 410 and power stage components 420A-420D arranged outside the perimeter of the inductor 410. The interposer board 405 also includes additional capacitors 430-434 arranged outside the perimeter of the inductor 410. The inductor 410, the capacitors 430-434 and 440, and the power stage components 420A-420D can be part of a power circuit that powers a load that is mounted on a PCB to which the power module 400 is also mounted.

The interposer board 405 also includes connectors 460, e.g., BGA balls of LGA pads. Each of the circles in FIGS. 4A and 4B designate a connector that is used to connect a component of the power module 400 to a pin of the load, e.g., via a connector of the PCB. The connectors 460, and the components (e.g., capacitors, inductors, and power stage components) can be arranged based on the pinout of the load, as described above.

For example, as shown in FIG. 4A, the interposer board 405 includes two connectors 412A and 412B on the second surface of the interposer board 405 in the area where the post 411A of the inductor 410 is mounted on the first surface of interposer board 405. One or both of these connectors 412A and 412B can be used to connect that portion of the inductor

410 to corresponding pin(s) of the load. The location of the connectors 412A and 412B and the location of the post 411 can match the location of the corresponding pin(s) of the load such that, when the power module 400 is mounted on the PCB, the connectors 412A and 412B are directly below (e.g., in a straight line) the corresponding pin(s). The interposer board 405 includes similar arrangements of connectors for each other post 411B-411H.

Similarly, the interposer board 405 includes two connectors 460 for each capacitor. The connectors 460 for a capacitor are arranged on the second surface under the area where the capacitor is mounted on the first surface. The location of each capacitor and its respective connectors can be based on the location of the pins of the load to which the capacitor will be connected when the power module is connected to the PCB.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

The invention claimed is:

1. An apparatus comprising:
   a printed circuit board (PCB) comprising a first PCB surface and a second PCB surface opposite the first PCB surface;
   one or more integrated circuits (ICs) attached to the first PCB surface; and
   one or more power modules attached to the second PCB surface, wherein each power module comprises:
       an interposer board (IB) comprising:
           a first IB surface and a second IB surface opposite the first surface;

one or more inductors mounted on the first IB surface, wherein:
       each of the one or more inductors comprises a top surface and a bottom surface opposite the top surface and that faces the first IB surface; and
       each of the one or more inductors is elevated above the first IB surface such that at least a portion of the bottom surface of the inductor does not contact the first IB surface; and
       for each of the one or more inductors, the interposer board comprises a plurality of capacitors arranged in an area below the portion of the bottom surface of the inductor that does not contact the first IB surface,
   wherein at least one of the one or more inductors comprise a dual-fed bridge coupled inductor comprising a plurality of inductor core posts that electrically connect the inductor to conductors of the IB and support the inductor on the first IB surface.

2. The apparatus of claim 1, wherein:
   each IC consumes a respective first area of the first PCB surface; and
   the one or more power modules comprise a respective power module for each IC; and
   the respective power module for each IC is installed in a respective second area of the second PCB surface directly opposite the respective first area for the IC.

3. The apparatus of claim 1, wherein:
   the second PCB surface comprises a plurality of capacitors that each include a portion that extends from the second PCB surface; and
   the second IB surface comprises, for each of the plurality of capacitors, a cavity configured to receive the portion that extends from the second PCB surface.

4. The apparatus of claim 1, further comprising a heat sink attached to the second PCB surface, wherein the heat sink is configured to fit around the one or more inductors and each other component attached to the first IB surface.

5. The apparatus of claim 4, wherein the heat sink provides a bolster plate that prevents the PCB from warping.

6. The apparatus of claim 4, wherein the first IB surface includes one or more power stage components and wherein the heat sink is in contact with each of the one or more power stage components.

7. The apparatus of claim 1, wherein each of the one or more inductors are mounted on one or more posts that extend from the inductor to the first surface of the interposer board.

8. The apparatus of claim 1, wherein:
   the IB comprises, for each respective IC from the one or more ICs, a plurality of connectors configured to match a pinout of the respective IC; and
   the one or more inductors and at least a portion of the capacitors of each power module are part of a power circuit configured to provide power to the respective IC.

9. The apparatus of claim 8, wherein the plurality of connectors comprise at least one of land grid array pads or ball grid array balls.

10. The apparatus of claim 8, wherein the plurality of connectors are configured to match the pinout of the respective IC from the one or more ICs such that one or more conductors that connect a component of the IB to respective one or more pins of the respective IC extend in a substantially straight line from the component to the respective one or more pins.

11. The apparatus of claim 1, wherein each post of the plurality of inductor core posts corresponds to a different phase of the dual-fed bridge inductor.

12. The apparatus of claim 11, wherein each inductor core post of the plurality of inductor core posts is configured to generate magnetizing flux for the corresponding phase of the respective inductor core post.

13. The apparatus of claim 1, wherein each inductor core post of the plurality of inductor core posts are configured to receive a pulse-width modulated waveform applied to the inductor core post.

14. The apparatus of claim 1, wherein a particular inductor core post of the plurality of inductor core posts is larger than each other inductor core post of the plurality of inductor core posts, wherein the particular inductor core post serves as a common mode leakage path that provides a common mode output inductance for the dual-fed bridge inductor.

15. The apparatus of claim 1, wherein the plurality of capacitors for each inductor comprises decoupling capacitors that are electrically connected to the inductor using conductors of the interposer board.

16. The apparatus of claim 1, further comprising a plurality of power stage components mounted on the first surface of the IB, wherein:

each of the one or more inductors comprises a coupled inductor electrically connected to at least one of the power stage components; and the power stage components, one or more inductors, and the plurality of capacitors for each inductor form one or more switching power supplies configured to provide power to an integrated circuit from the one or more integrated circuits of a printed circuit board to which a power module from the one or more power modules is connected.

17. The apparatus of claim 1, wherein each of the one or more inductors are mounted on one or more posts that extend from the inductor to the first surface of the interposer board and wherein the one or more posts are arranged on the first surface to define an area on the first surface.

18. The apparatus of claim 17, wherein the plurality of capacitors corresponding to at least one of the one or more inductors are arranged on the defined area of the first surface.

19. The apparatus of claim 1, wherein the one or more integrated circuits comprise one or more of (i) an application-specific integrated circuit, (ii) a graphical processing unit, (iii) a central processing unit, or (iv) a field-programmable gate.

\* \* \* \* \*